United States Patent [19]
Murray et al.

[11] Patent Number: 6,166,982
[45] Date of Patent: *Dec. 26, 2000

[54] HIGH VOLTAGE SWITCH FOR EEPROM/ FLASH MEMORIES

[75] Inventors: Kenelm Murray, Sunnyvale; Donato Montanari, Mountain View, both of Calif.

[73] Assignee: Cypress Semiconductor Corp., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/104,919

[22] Filed: Jun. 25, 1998

[51] Int. Cl.⁷ ............................................. G11C 7/00
[52] U.S. Cl. ..................... 365/226; 365/227; 365/185.33
[58] Field of Search .................. 365/185.23, 185.33, 365/191, 242, 185.05, 185.19, 226, 227; 327/143; 360/51; 307/605

[56] References Cited

U.S. PATENT DOCUMENTS

| | | | |
|---|---|---|---|
| 4,829,391 | 5/1989 | Vargas, Jr. | 360/51 |
| 4,874,971 | 10/1989 | Fletcher | 307/605 |
| 4,897,774 | 1/1990 | Bingham et al. | 363/61 |
| 4,935,644 | 6/1990 | Tsujimoto | 307/296.2 |
| 5,059,815 | 10/1991 | Bill et al. | 307/246 |
| 5,276,646 | 1/1994 | Kim et al. | 365/189.09 |
| 5,311,480 | 5/1994 | Schreck | 365/230.06 |
| 5,319,604 | 6/1994 | Imondi et al. | 365/230.06 |
| 5,371,705 | 12/1994 | Nakayama et al. | 365/189.09 |
| 5,438,542 | 8/1995 | Atsumi et al. | 365/182 |
| 5,461,557 | 10/1995 | Tamagawa | 363/60 |
| 5,587,951 | 12/1996 | Jazayeri et al. | 365/203 |
| 5,592,430 | 1/1997 | Ohtsuki | 365/226 |
| 5,701,272 | 12/1997 | Brennan, Jr. | 365/230.06 |
| 5,757,228 | 5/1998 | Furutani et al. | 327/589 |
| 5,767,735 | 6/1998 | Javanifard et al. | 327/536 |
| 5,796,656 | 8/1998 | Kowshik et al. | 365/185.23 |
| 5,812,459 | 9/1998 | Atsumi et al. | 365/185.23 |
| 5,841,696 | 11/1998 | Chen et al. | 365/185.11 |
| 5,889,664 | 3/1999 | Oh | 363/60 |
| 5,986,936 | 11/1999 | Ravazzini | 365/185.19 |
| 6,005,424 | 12/1999 | Douglass | 327/143 |

OTHER PUBLICATIONS

IEEE JSSC, vol. 33, No. 1, Jan. 1998, Internal Voltage Generator for Low Voltage Quarter–Micrometer Flash Memories, T. Kawahara, et al.

IEEE JSSC, vol. 32, No. 8, Aug. 1997, "Circuit Techniques for 1.5V Power Supply Flash Memory", N. Otsuka and M. Horowitz.

IEEE JSSC, vol. 31, No. 11, Nov. 1996, "Bit–Line Clamped Sensing Multiplex and Accurate High Voltage Generator for Quarter–Micron Flash Memories", T. Kawahara, et al.

IEEE JSSC, vol. 27, No. 11, Nov. 1992, A 5V–only 16Mb Flash Memory with Sector Erase Mode, T. Jinbo et al.

IEEE JSSC, vol. 27, No. 11, Nov. 1992, A 5V–only Operation 0.6–μm Flash EEPROM with Row Decoder Scheme in Triple–Well Structure A. Umezawa, et al.

"Non–Volatile Semiconductor Memories, Technologies, Design and Applications", IEEE Press, Ed Chenming Hu, 1991.

IEEE JSSC, vol. 24, No. 5, Oct. 1989, "Analysis and Modeling of On–Chip High–Voltage Generator Circuits for Use in EEPROM Circuits", Witters, et al.

(List continued on next page.)

Primary Examiner—David Nelms
Assistant Examiner—Thong Le
Attorney, Agent, or Firm—Christopher P. Maiorana, P.C.

[57] ABSTRACT

A high voltage switch for use in an EEPROM/FLASH memory that may be implemented using a twin-well process (e.g., using only P-channel transistors). The circuit comprises a positive switch configured to present a first and a second switch signal in response to (i) one or more select signals and (ii) an address signal and a second switch configured to present a programing voltage in response to (i) the select signals, (ii) the first and second switch signals and (iii) a high voltage source. A high voltage positive and negative pump may provide the high voltage source.

20 Claims, 3 Drawing Sheets

OTHER PUBLICATIONS

IEEE JSSC, vol. 32, No. 6, Jun. 1997, "Efficiency Improvement in Charge Pump Circuits", Wang et al.

IEEE JSSC, vol. 32, No. 1, Jan. 1997, "Program Load Adaptive Voltage Generator for Flash Memories", Fiocchi, et al.

IEEE JSSC, vol. SC–18, No. 5, Oct. 1983, "Control Logic and Cell Design for a 4K NVRAM", Lee, et al.

IEEE JSSC, vol. SC–18, No. 5, Oct. 1983, "High–Voltage Regulation and Process Considerations for High–Density 5V–only $E^2PROM$'s", Oto, et al.

IEEE JSSC, vol. SC–11, No. 4, Jun. 1976, "On–Chip High–Voltage Generation in NMOS Integrated Circuits Using an Improved Voltage Multiplier Technique", John F. Dickson.

HIGH VOLTAGE SWITCH FOR EEPROM/FLASH MEMORIES

FIELD OF THE INVENTION

The present invention relates to high voltage switches generally and, more particularly, to a high voltage switch for use in an EEPROM/FLASH memory.

BACKGROUND OF THE INVENTION

Conventional approaches to providing a high voltage switch in an EEPROM or a FLASH memory can include the implementation of the switch with a triple-well process. In a triple-well process, both P-channel and N-channel transistors may be implemented with controllable substrates and may therefore operate more efficiently in the high voltage domain. The implementation of the N-channel transistors in this way may allow for switching of the negative voltages associated with the programming of the device. U.S. Pat. No. 5,701,272 illustrates one such approach. However, a triple-well process is more expensive to fabricate than a twin-well process due to the additional fabrication steps required. As a result, certain devices are implemented in a twin-well process in order to satisfy design constraints other than those that may be associated with the implementation of on-chip charge pumping and switching circuitry.

When implementing a switch circuit using a twin-well process and conventional approaches such as, by way of example, in an N-well process with a P-substrate, it is difficult to switch the high negative voltages associated with the programming of selected memory cells without the use of N-channel transistors. N-channel transistors cannot be used here for negative switching since the source/drain diffusion diode junctions would forward bias to the grounded P-substrate. P-channel transistors used for controlling negative voltages are difficult to turn on since the gates of these P-channel transistors would have to go even further negative making the gate drivers, in turn, even harder to control.

Certain approaches to implementing a switch in a twin-well process have the disadvantages of not fully passing the negative voltages. For example, a −12V may be reduced to a −6V, which decreases the overall efficiency of the circuit as well as increasing the amount of negative voltage that an on-chip charge pump must generate. Specifically, if a −12V is desired for programming the memory, the pump may have to generate a −15V, which may be at the limit of certain process technologies.

Charge pumps may be implemented to generate a very high voltage (e.g., 15V) or a very low voltage (e.g., −15V). The output of the charge pump or pumps must then be directed to the selected memory cells for the various erasing/programming or verifying/reading functions.

SUMMARY OF THE INVENTION

The present invention concerns a high voltage switch for use in an EEPROM/FLASH memory that may be implemented using a twin-well process and P-channel transistors. The circuit comprises a positive switch configured to present a first and a second switch signal in response to (i) one or more select signals and (ii) an address signal and a second switch configured to present a programming voltage in response to (i) the select signals, (ii) the first and second switch signals and (iii) a high voltage source. A high voltage positive and negative pump may provide the high voltage sources.

The objects, features and advantages of the present invention include providing a high voltage switch that may (i) be capable of steering negative voltages in a twin-well process, (ii) be capable of steering positive voltages in a twin-well process, (iii) reduce the overall chip area necessary to implement the switch, and (iv) pass programming voltages efficiently.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
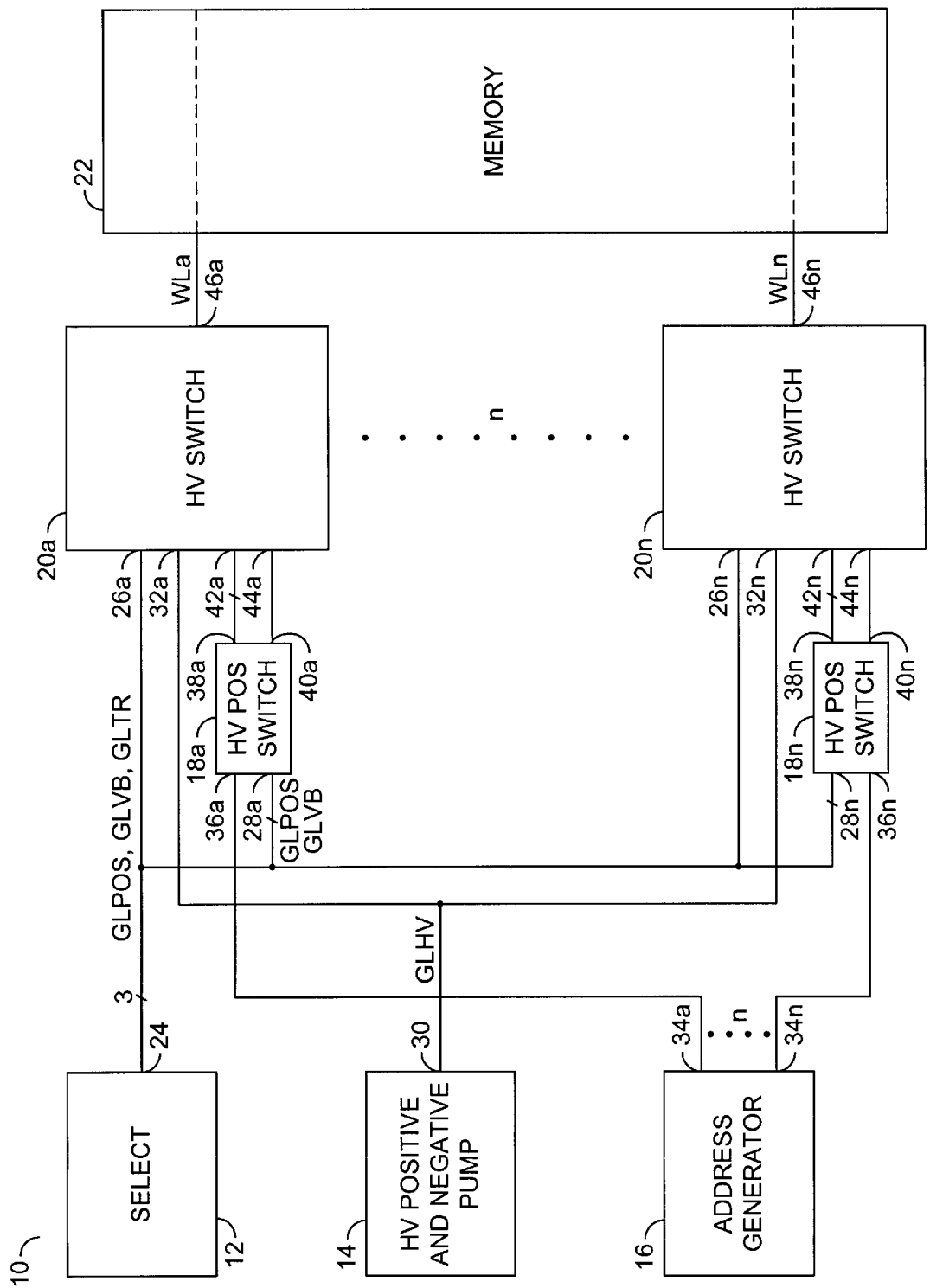
FIG. 1 is a block diagram of a preferred embodiment of the present invention.

Referring to FIG. 1, a circuit 10 is shown in accordance with a preferred embodiment of the present invention. The circuit 10 generally comprises a select block (or circuit) 12, a high voltage positive and negative pump 14, an address generator 16, a number of high voltage positive switches 18a–18n, a number of high voltage switches 20a–20n and a memory 22. The select circuit 12 may present a number of signals (e.g., a signal GLPLS, a signal GLVB, and a signal GLTR) at an output 24 that may control the particular voltage presented by the HV switches 20a–20n and thereby select a function mode to which the chosen non-volatile sector (or wordline) will be subjected (e.g., erase, program or read). The control signals may be presented to an input 26a of the HV switch 20a and an input 26n of the HV switch 20n. The control signals GLPOS and GLVB may also be presented to an input 28a of the HV positive switch 18a and an input 28n of the HV positive switch 18n.

The HV positive and negative pump 14 may present a high voltage pump signal (e.g, GLHV) at an output 30. The signal GLHV may be presented to an input 32a of the HV switch 20a and an input 32n of the HV switch 20n. The signal GLHV may be either a very high positive voltage (e.g., 15V) or a very low negative voltage (e.g., −15V). The HV positive and negative pump 14 may be implemented as either a single pump that may generate both high voltages and low voltages or two separate pumps (e.g., a positive pump and a negative pump) along with a steering network to generate the particular voltage required. An example of a steering network that may be implemented with separate positive and negative pumps may be found in co-pending application, attorney docket number 0325.00162, Serial No. 09/104,919, filed on Jun. 25, 1998, which is hereby incorporated by reference in its entirety. An example of a positive and negative pump may be found in the referenced co-pending application. Additionally, the particular high and low voltages presented at the output 30 may be related to the particular process technology used. For example, if the outputs of the HV switches 20a–20n are driving a technology that uses lower programming voltages, voltages lower than 15V and higher than −15V may be presented at the output 30.

The address generator 16 has a number of outputs 34a–34n that may present individual local address signals (e.g., ADDRESSa–n) at an input 36a–36n of the HV positive switches 18a–18n. The address signals presented at the outputs 34a–34n may be local address signals that each activate a particular one of HV positive switches 18a–18n. The HV positive switches 18a–18n may each have a respective output 38a–38n and 40a–40n that may present signals to a respective input 42a–42n and 44a–44n of the HV switches 20a–20n.

The HV switches 20a–20n may comprise an output 46a–46n that may be coupled to a respective wordline WLa–WLn of the memory 22. Since each of the HV switches 20a–20n is activated by a particular address signal ADDRESSa–n, that may be generated by the address generator 16, only one of the wordlines WLa–WLn is generally activated at a particular time. As a result, smaller memory sectors can be individually selected for erasing/programming. These sectors comprise all those memory cells addressed by any single word line.

Figure 2:
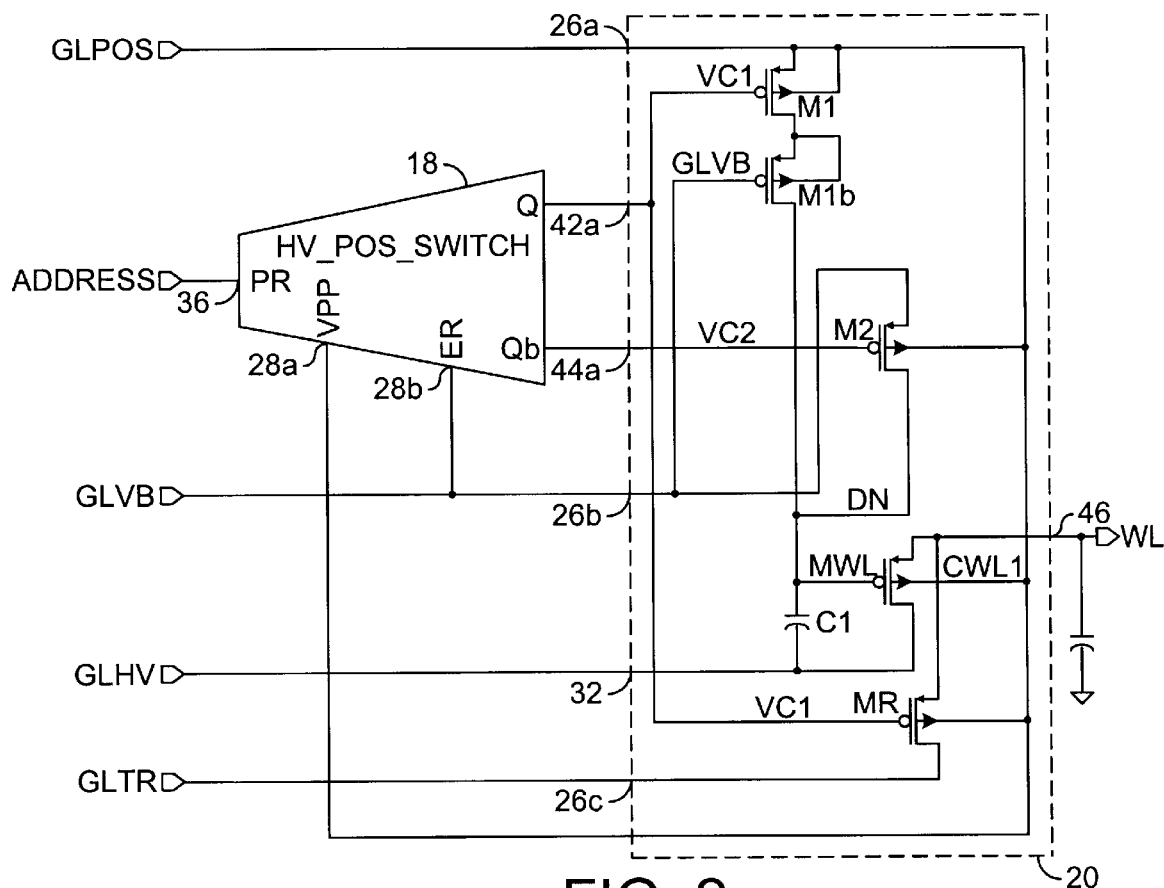
FIG. 2 is a circuit diagram of the high voltage switch and the high voltage positive switch of FIG. 1.

Referring to FIG. 2, a circuit diagram of the block 18 and the block 20 of FIG. 1 is shown. The block 18 is shown having an input 36 that receives the signal ADDRESS. The signal GLPOS is shown presented to an input 26a of the block 20 as well as to an input 28 of the block 18. The signal GLVB is shown presented to the input 28b of block 18 as well as to an input 26b of the block 20. The signal GLHV is shown presented to an input 32 of the block 20. The signal GLTR is shown presented to the input 26c of the block 20.

The block 20 generally comprises a transistor M1, a transistor M1b, a transistor M2, a transistor MW1, a transistor MR, and a capacitor C1. The signal received at the input 42a may be represented as a signal VC1 and may be presented to the gate of the transistor M1 as well as to the gate of the transistor MR. The signal received at the input 44a may be represented as a signal VC2 and may be presented to the gate of the transistor M2. The source of the transistor M1 may be coupled to the input 26. The drain of the transistor M1 may be coupled to the source of the transistor M1b. The drain of the transistor M1b may be coupled to the gate of the transistor MWL as well as to a first side of the capacitor C1. A second side of the capacitor C1 may be coupled to the input 32 as well as to the drain of the transistor MWL. The source of the transistor MWL may be coupled to the output 46. The output 46 generally drives the wordlines WLa–WLn of the memory 22 of FIG. 1.

The circuit 10 may provide particular operational conditions on the wordlines WLa–WLn. For example, when in a program mode, the selected wordline WLa–WLn may be brought down to −7V, whereas the de-selected wordlines WLa–WLn generally stay at Vcc, where Vcc may be in the neighborhood of 3V. When in erase mode, the selected wordline WLa–WLn may be at +15.5V, and the de-selected wordlines WLa–WLn generally stay at 5V. When in read mode, all of the wordlines WLa–WLn are generally at Vcc, where Vcc is in the neighborhood of 3V. These de-selected word line bias levels are described for implementation with a two transistor EEPROM or FLASH memory cell, the second transistor being a select device capable of isolating the cell when de-selection is required. Hence, read selection may be carried out on the select gate of the device, while all the wordlines WLa–WLn are at Vcc, which may improve the access time of the memory 22, Vcc being in the neighborhood of 3V. For a single transistor EEPROM or FLASH memory cell, the de-selected wordlines are held at Vss for PROGRAM and READ and at 5V for ERASE.

The circuit 20 may comprise a network of PMOS high voltage transistors (M1, M1B, M2, Mw1) that may be connected to the capacitor C1, a reset PMOS high voltage transistor (Mr) that may be directly connected to the wordline (WL). The circuit 10 may be driven by the signals GLPOS, GLHV, GLTR and GLVB that are generally global to all the wordlines WLa–WLn in the memory 22. The voltage levels of the global signals in the different operational modes are given in the following TABLE 1:

TABLE 1

| SIGNAL | READ | ERASE | PROGR. |
| --- | --- | --- | --- |
| GLPOS | Vcc | Vpp | Vcc |
| GLVB | Vss | 5 V | Vss |
| GLHV | Vcc | Vpp | Vnn |
| GLTR - 2 T cell | Vcc | 5 V | Vcc |
| GLTR - 1 T cell | Vss | 5 V | Vss |

The transistors M1, M2, Mw1 and Mr of circuit 20 may each be implemented in the same nwell, which is generally connected to the signal GLPOS. The transistor M1b may be implemented in a separate well and may function to protect the transistor M1 from breakdown. The transistor M1b may be optional depending on the maximum breakdown voltage in a given technology and the values of extreme positive or negative voltages required for ERASE and PROGRAM operations.

The outputs 42 and 44 of the HV positive switch 18 logically follow the low-voltage input signal ADDRESS, but have a voltage that may be either Vcc or Vpp, depending on the value of the signal GLPOS. For instance, in erase mode, the output 42 may be at Vpp if the wordline is selected (e.g., the signal ADDRESS logic high) or may be at Vss if the wordline WLa–WLn is de-selected (e.g., the signal ADDRESS is at a logic low). However, in read and program modes, the signals 42 and 44 will be at Vcc if the wordline WLa–WLn is selected.

In general, six different operational modes may exist for the circuit 20 which may include read selected, read de-selected, erase selected, erase de-selected, program selected and program de-selected.

Referring to FIG. 2 and TABLE 1, when in read mode the signal GLVB may be at Vss and the transistor M1b is generally on. A read selected condition may occur when the signal ADDRESS is high which implies Vc1=Vcc and Vc2=Vss since in read mode both signals GLPOS and GLHV are at Vcc (as noted in TABLE 1). When the transistor M1 is off, the transistor M2 is generally on and passes the signal GLVB to the node DN. In read mode the signal GLVB is at Vss, but since a PMOS device is used (NMOS devices generally cannot be utilized in a twin-well process, as explained previously), the node DN is up to one threshold voltage higher than Vss. The transistor Mw1 is then on and passes the signal GLHV, which in read mode is at Vcc, on the wordline WL, leaving capacitor C1 slightly charged. The transistor Mr is off, since the signal ADDRESS is high.

A read de-selected condition may occur in the case where the signal ADDRESS is low. The transistor Mr is on and Vcc is passed to the wordline WL. When the signal ADDRESS is low, Vc1=Vss and Vc2=Vcc, which implies the transistor M2 is off and the transistor M1 is on. Therefore, the node DN is at Vcc, the capacitor C1 is charged at Vcc, and the transistor Mw1 is off.

When in an erase mode, the signals GLPOS and GLHV go up to Vpp and the signals GLVB and GLTR are generally at 5V. The 5V may be needed in order to overcome junction breakdown problems that may occur on the transistors Mr and M1.

An erase selected condition may occur when the high voltage HV positive switch 18 provides a logic high signal to the gate of the transistor M1, which, in this example, may correspond to Vc1=Vpp. Therefore, the transistor M1 is generally off. However, the transistor M2 is generally on since Vc2=Vss. This keeps the node DN at 5V. Thus, the transistor Mw1 may be on and the positive high voltage signal GLHV may be passed to wordline WL. Since the signal ADDRESS may be high and Vc1=Vpp, the transistor Mr may be off. In general, the erase selected mode does not require dynamic coupled techniques to pass the positive high voltage.

An erase de-selected condition may occur when the signal ADDRESS is low which means Vc1=Vss and Vc2=Vpp. Thus, the node DN is at Vpp which may prevent the signal GLHV from passing on to the wordline WL. However, the transistor Mr is generally on and the wordline WL is generally at 5V.

Two program modes may be generated, a program selected and a program de-selected. A program selected condition may occur when, similar to the read selected case, Vc2=Vss and, since GLVB is at Vss, the node DN is not higher than Vss plus a threshold voltage. The transistors M1 and Mr are off. However, in this case as the signal GLHV goes negative, the transistor M2 may be shut off as well. This allows the node DN to dynamically follow the signal GLHV since it is no longer anchored to Vss by the transistor M2. Thus, the transistor Mw1 is turned on and most of the negative voltage on the signal GLHV is transmitted to the wordline WL.

A program de-selected condition may occur when, as in the previous read de-selected case, Vc1=Vss, Vc2=Vcc and with GLVB at Vss the node DN is at Vcc. Whereas the transistor M2 is off, the transistor Mr is on and the wordline WL=Vcc. In contrast, as the signal GLHV goes negative, the transistor M1 generally stays fully on. The transistor M1b is also on with a voltage Vss on its gate and the node DN is held positive. Hence, the negative voltage on the signal GLHV is not able to dynamically pull node DN negatively and the negative voltage is not transmitted, therefore, to the wordlines WL, as Mw1 is off.

Figure 3:
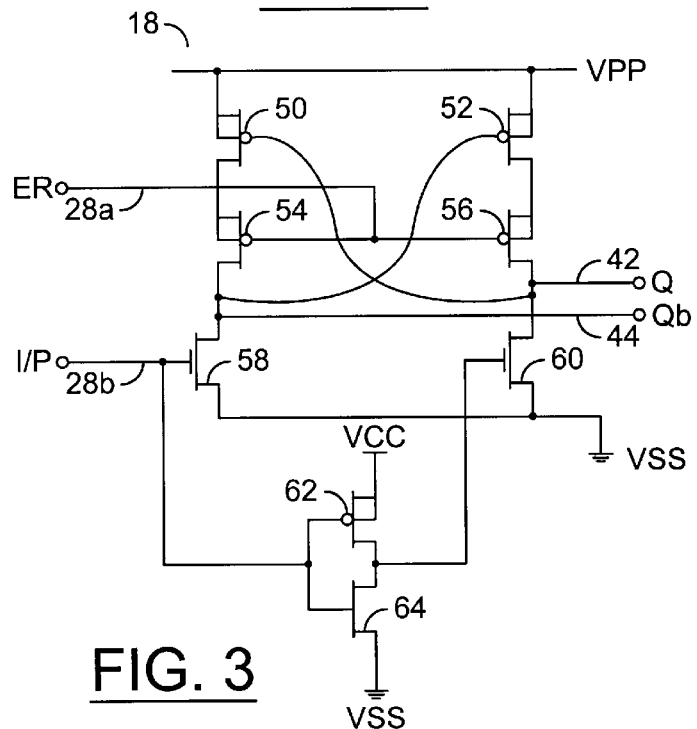
FIG. 3 is a circuit diagram of the high voltage positive switch of FIG. 1.

Referring to FIG. 3, a more detailed diagram of the HV positive switch 18 is shown generally comprising a transistor 50, a transistor 52, a transistor 54, a transistor 56, a transistor 58, a transistor 60, a transistor 62, and a transistor 64. The output 44 and the output 42 are generally complementary signals. In general, as the signal at the input 28b transitions between a zero and Vcc, the signal at the output 42 transitions between zero and Vpp. A signal ER may typically stay at a zero volts and may be taken to a Vcc when Vpp is at a very high voltage (e.g., 15V) or when junction breakdowns may occur in the P transistors (e.g., the transistors 50, 52, 54 and 56 ).

Figure 4:
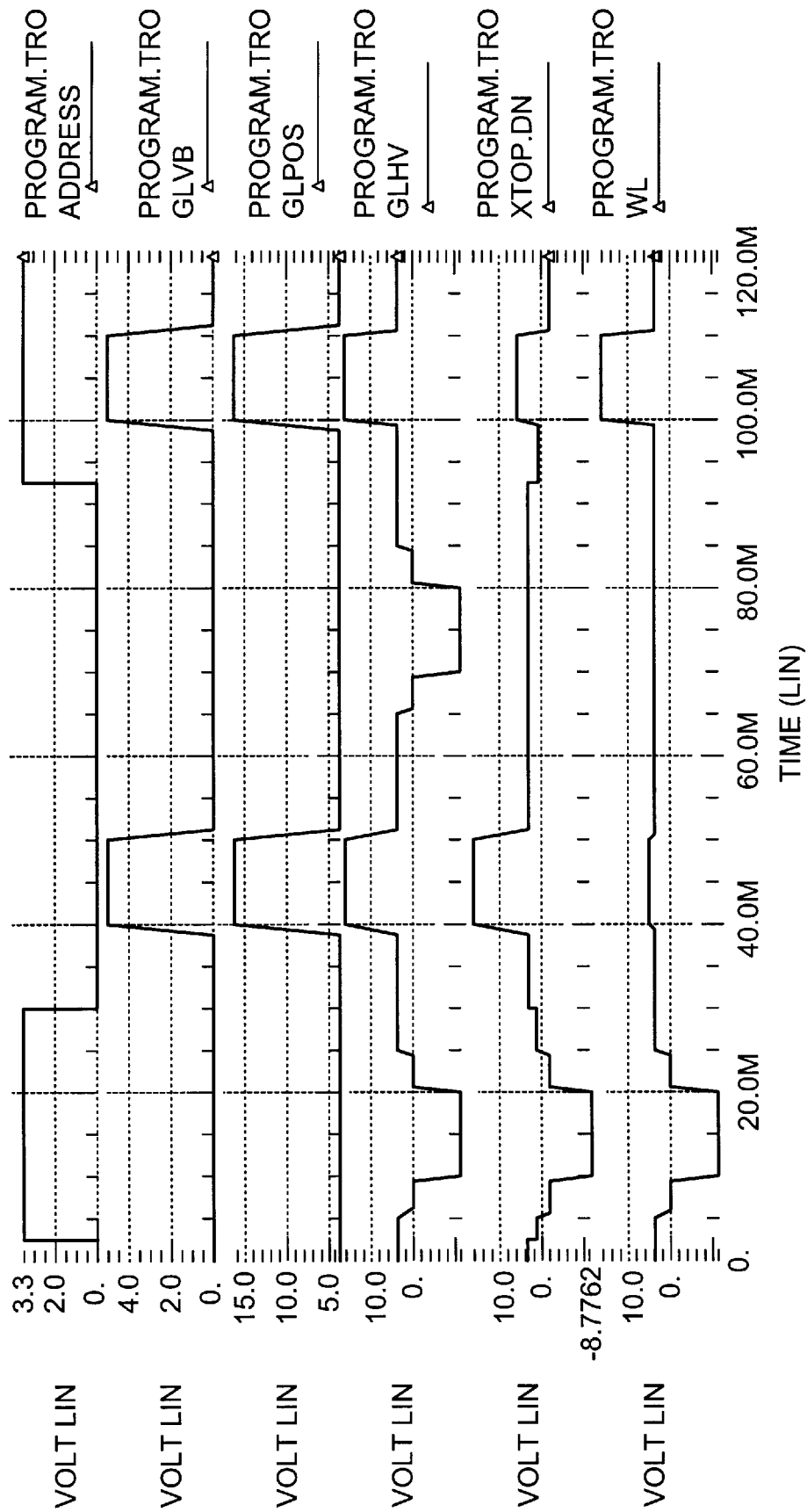
FIG. 4 is a timing diagram illustrating the various waveforms of the circuit of FIG. 1.

FIG. 4 shows a transient simulation where the wordline WL is selected for the first 30 ms, de-selected for the successive 60 ms and then selected again for the last 30 mS. During each of the 30 ms intervals, either an erase or a program operation is generally performed. When the wordline WL is selected (e.g., the signal ADDRESS high) the signal on the wordline WL generally follows the signal GLHV by delivering both positive and negative voltages. However, when the wordline WL is not selected, the voltage on the wordline WL generally stays at Vcc. The signal XTOP.DN generally represents the waveform of the node DN.

In general, in order to program a particular cell, first the signal ADDRESS is selected and then a program enable state is asserted. As soon as the signal ADDRESS goes high, the node DN goes down from Vcc to Vss plus a threshold (e.g., ~1V). At this specific time the signal GLHV generally remains at Vcc. Subsequently, when the program enable state is asserted, the signal GLHV may typically transition from Vcc to Vss (e.g., a transition from positive to negative high voltage generation mode), and then the signal GLHV may transition from Vss to Vnn (e.g., the negative charge pump delivering Vnn). More specifically, the program enable state may be asserted by the external input GLHV dropping from Vcc to Vss a short time before GLHV drops to Vnn, the full negative programming voltage. In general, the interval must not be too long since dynamic coupling is taking place. The node DN generally may follow such transitions through the coupling capacitor C1. As the signal GLHV transitions negative, the node DN is generally at −2V. This negative bootstrap effect may allow the transfer of −7V across the transistor Mw1 without requiring the signal GLHV to go much more negative than 7V since the gate of Mw1 is already two volts more negative. This can be seen in the simulation results of FIG. 4 when the signal GLHV is at −7V and the wordline is selected with XTOP.DN at −9V, thus more negative, which allows −7V to transfer to the output wordline WL.

The capacitance Cw11 may represent the load capacitance due to the memory cells. This capacitance varies with the number of bits addressed by each wordline and the particular non-volatile technology. However, the capacitance C1 is generally not driving the entire wordline WL. Hence, the dimensions of the capacitor C1 do not depend on the value of Cw11 and, therefore, the silicon area of the switch implemented in the present invention is largely independent of the number of bits addressed by the wordline. The dimensions of the capacitor C1 generally depend on the parasitics of transistors M1, M2 and Mw1. During dynamic coupling, the gate capacitance of the transistor Mw1 (which may be the largest contributing factor to the overall capacitance) is generally connected in parallel with capacitance C1 after the transistor Mw1 turns on. As a result, the parasitic capacitance of the transistor Mw1 may improve the coupling of the wordline WL. In one example, the transistor C1 may be 10 times larger than the overall parasitics caused by the transistors M1, M2 and Mw1. The capacitance C1 may be implemented as an interpoly capacitance.

To simplify the pitching of the circuit 10, the gates of the transistor Mr (in each of the wordlines WLa–WLn) may be alternately connected together to an additional global control line instead of being connected to Vc1. This may reduce the layout of the circuit 10. When an erase or program operation occurs, the transistor Mr may be switched off on all the wordlines WLa–WLn. However, this may leave the unselected wordlines WLa–WLn floating for the duration of the operation (10–100 ms), which might be a drawback in certain design applications.

The transistor M1b may be omitted if the signal GLVB were brought higher than 5V during erasing. A voltage of 5.5–6.5V may be enough to pass 5V on the node DN, in spite of the body bias effect of the transistor M2. With such configuration, the overall voltage across the transistor M1 would be about 10V.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a dynamic switch configured to present an output based upon an input, configured to vary between a high positive voltage level and a low negative voltage level, wherein said high positive voltage level comprises a first voltage level above a positive supply voltage level and said low negative voltage level comprises a second voltage level below a negative supply voltage level.

2. The circuit of claim 1; wherein said dynamic switch further comprises a dynamic circuit element.

3. The circuit of claim 2, wherein said dynamic circuit element further comprises a capacitor.

4. The circuit of claim 1, wherein said dynamic switch further comprises a plurality of transistors that all have the same channel type.

5. The circuit of claim 4, wherein said plurality of transistors are p-channel transistors.

6. The circuit of claim 2, wherein said dynamic switch further comprises a transistor coupled to said output, and wherein said transistor is activated by said dynamic circuit element.

7. The circuit of claim 1, wherein said dynamic switch is manufactured using a twin-well process.

8. The circuit of claim 1, wherein said output is coupled to an electrically erasable programmable read only memory (EEPROM).

9. The circuit of claim 8, wherein said output is coupled to a wordline of said EEPROM.

10. A memory device, comprising:
    a memory array configured to write data in response to a programming signal on a wordline;
    a dynamic switch configured to present said programming signal on said wordline based upon an input configured to vary between a high positive voltage level and a low negative voltage level, wherein said high positive voltage level comprises a first voltage level above a positive supply voltage level and said low negative voltage level comprises a second voltage level below a negative supply voltage level.

11. The circuit of claim 10, wherein said dynamic switch further comprises a dynamic circuit element.

12. The circuit of claim 11, wherein said dynamic circuit element further comprises a capacitor.

13. The circuit of claim 10, wherein said dynamic switch further comprises a plurality of transistors that all have the same channel type.

14. The circuit of claim 13, wherein said plurality of transistors are p-channel transistors.

15. The circuit of claim 11, wherein said dynamic switch further comprises a transistor coupled to said programming signal, and wherein said transistor is activated by said dynamic circuit element.

16. A method for high voltage switching comprising the steps of:
    (A) receiving an address corresponding to a wordline of a memory device;
    (B) activating a dynamic switch based upon said address; and
    (C) dynamically driving said wordline, with said dynamic switch, to a voltage that varies between a high positive voltage level and a low negative voltage level, wherein said high positive voltage level comprises a first voltage level above a supply voltage level and said low negative voltage level comprises a second voltage level below a negative supply voltage level.

17. The method according to claim 16, wherein said dynamic switch further comprises a dynamic circuit element.

18. The method according to claim 17, wherein said dynamic circuit element further comprises a capacitor.

19. The method according to claim 16, wherein said dynamic switch further comprises a plurality of transistors that all have the same channel type.

20. The method according to claim 16, wherein memory device comprises an electrically erasable programmable read only memory (EEPROM).

* * * * *